(12) United States Patent
Gerard et al.

(10) Patent No.: US 8,885,682 B2
(45) Date of Patent: Nov. 11, 2014

(54) TERAHERTZ WAVE EMISSION LASER DEVICE WITH A PERFORATED STRUCTURE

(71) Applicant: Commissariat a l'Energie Atomique et aux Energies alternatives, Paris (FR)

(72) Inventors: Jean-Michel Gerard, Saint-Martin-d'Uriage (FR); Julien Claudon, Saint-Martin-le-Vinoux (FR); Giuseppe Leo, Fontenay-sous-Bois (FR); Alessio Andronico, Charenton-le-Pont (FR); Mathieu Munsch, Mulhouse (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/873,566

(22) Filed: Apr. 30, 2013

(65) Prior Publication Data
US 2013/0287056 A1 Oct. 31, 2013

(30) Foreign Application Priority Data

Apr. 30, 2012 (FR) ...................................... 12 53986

(51) Int. Cl.
| | |
|---|---|
| *H01S 5/00* | (2006.01) |
| *H01S 5/10* | (2006.01) |
| *H01S 3/08* | (2006.01) |
| *G02F 1/35* | (2006.01) |
| *H01S 5/34* | (2006.01) |
| *H01S 5/06* | (2006.01) |
| *H01S 5/183* | (2006.01) |

(52) U.S. Cl.
CPC ........... *H01S 3/08018* (2013.01); *H01S 5/1075* (2013.01); *H01S 5/3412* (2013.01); *G02F 1/3534* (2013.01); *H01S 5/0607* (2013.01); *H01S 5/1096* (2013.01); *H01S 5/0604* (2013.01); *H01S 5/18375* (2013.01)
USPC ........................................................ 372/50.1

(58) Field of Classification Search
USPC ........................................................ 372/50.1
See application file for complete search history.

(56) References Cited

U.S. PATENT DOCUMENTS

| | | | | |
|---|---|---|---|---|
| 7,319,711 B2 * | 1/2008 | Kwon et al. | ..................... | 372/92 |
| 2005/0286602 A1 * | 12/2005 | Gunn et al. | ..................... | 372/94 |

(Continued)

FOREIGN PATENT DOCUMENTS

FR          2 932 616          12/2009

OTHER PUBLICATIONS

Tonouchi, M., "Cutting-edge terahertz technology," Nature Photonics, vol. 1, Feb. 2007, pp. 97-105.

(Continued)

*Primary Examiner* — Xinning Niu
*Assistant Examiner* — Vu A Vu
(74) *Attorney, Agent, or Firm* — Pillsbury Winthrop Shaw Pittman LLP (57) ABSTRACT

A laser device for emitting THz waves includes a heterostructure with a substantially cylindrical shape including a first layer in an optically nonlinear semiconductor material including emitters to emit in two whispering gallery modes that are confined in the first layer and enabling the generation within the first layer of radiation in an electromagnetic THz whispering gallery mode, a second and a third layer in a semiconductor material each presenting an optical index that is smaller than the index of the material used for the first layer and a metal layer situated at one end of the heterostructure. The heterostructure includes in its center a hole with a substantially cylindrical shape extending over the entire height of the heterostructure.

14 Claims, 5 Drawing Sheets

(56) References Cited

U.S. PATENT DOCUMENTS

2007/0228355 A1* 10/2007 Singh .............................. 257/10
2010/0264300 A1* 10/2010 Savchenkov et al. .... 250/227.18
2011/0188525 A1* 8/2011 Claudon et al. ................. 372/34
2012/0056072 A1* 3/2012 Fourguette et al. ........ 250/201.1

OTHER PUBLICATIONS

Koch, M., "Terahertz Technology: A Land to Be Discovered," Optics and Photonics News, Mar. 2007, pp. 21-25.
Mittleman, D., "Sensing with Terahertz Radiation," Springer Series in Optical Sciences, vol. 85, 2003, 1 page.
Brown, E.R., et al., "Photomixing up to 3.8 THz in lowtemperaturegrown GaAs," Applied Physics Letters, vol. 66, No. 3, Jan. 16, 1995, pp. 285-287.
Verghese, S., et al., "Generation and detection of coherent terahertz waves using two photomixers," Applied Physics Letters, vol. 73, No. 26, Dec. 28, 1998, pp. 3824-3826.
Köhler, R., et al., "Terahertz semiconductor-heterostructure laser," Nature, vol. 417, May 9, 2002, pp. 156-159.
Aggarwal, R. L., et al., "Noncollinear phase matching in GaAs," Applied Physics Letters, vol. 22, No. 7, Apr. 1, 1973, pp. 329-330.
Yang, K. H., et al., "Generation of FarInfrared Radiation by Picosecond Light Pulses in LiNbO3," Applied Physics Letters, vol. 19, No. 9, Nov. 1, 1971, pp. 320-323.
Lee, Y.-S., et al., "Generation of narrow-band terahertz radiation via optical rectification of femtosecond pulses in periodically poled lithium niobate," Applied Physics Letters, vol. 76, No. 18, May 1, 2000, pp. 2505-2507.
Vodopyanov, K. L., et al., "Terahertz-wave generation in quasi-phase-matched GaAs," Applied Physics Letters, vol. 89, No. 14, 2006, 3 pgs.
Berger, V., et al., "Nonlinear phase matching in THz semiconductor waveguides," Semicond. Sci. Technol., Institute of Physics Publishing, vol. 19, 2004, pp. 964-970.
Search Report and Written Opinion as issued for French Patent Application No. 1253986, dated Mar. 15, 2013.
Munsch, et al., "Room temperature, continuous wave lasing in microcylinder and microring quantum dot laser diodes," Applied Physics Letters, vol. 100, No. 3, 2012, 4 pages.
Andronico, et al., "Integrated terahertz source based on three-wave mixing of whispering-gallery modes," Optics Letters, vol. 33, No. 21, Nov. 21, 2008, pp. 2416-2418.
Andronico, et al., "Quantum-dot based nonlinear source of THz radiation," Proceedings of SPIE, vol. 8119, Sep. 8, 2011, 6 pages.
Andronico, et al., "Difference frequency generation in GaAs microdisks," Optics Letters, vol. 33, No. 18, Sep. 15, 2008, pp. 2026-2028.
Fasching, et al., "Microcavity THz quantum cascade laser," Physica E, vol. 32, No. 1-2, 2006, pp. 316-319.
Adam, et al., "The Design and Fabrication of Microdisk Resonators for Terahertz Frequency Operation," IEEE, 2002, pp. 402-408.
Mujagić, et al., "Vertically emitting terahertz quantum cascade ring lasers," Applied Physics Letters, vol. 95, No. 1, 2009, 3 pages.

* cited by examiner

2. Bonding on a host substrate

1. Deposition of the lower mirror

3. Removal of the growth substrate and the sacrificial layer

Fig. 9d

4. Lithography, deposition of the upper mirror and hard mask, lift-off

Fig. 9e

5. Etching and removal of the hard mask residue

Fig. 9f

TERAHERTZ WAVE EMISSION LASER DEVICE WITH A PERFORATED STRUCTURE

CROSS-REFERENCE TO RELATED APPLICATIONS

This application is based upon and claims the benefit of priority from French Patent Application No. 1253986, filed Apr. 30, 2012, the entire content of which is incorporated herein by reference.

The present invention relates to a laser device with a wave emission within a frequency range of between 0.5 THz and 5 THz.

The terahertz (THz) region of the electromagnetic spectrum is between microwaves and far infrared and ranges from 500 GHz (0.5 THz) to 5 THz (typically 1 THz corresponds to an energy of 4 meV or else to a vacuum wavelength of 300 μm).

THz sources find their main applications in spectroscopy and imaging in the fields of security and medicine. They can also be used for short-distance free-space telecommunications (for example inside buildings), for the non-destructive analysis of foods, top coats and integrated circuits. THz technologies are generally described in the documents "Cutting-edge terahertz technology," (M. Tonouchi, Nature Photonics, February 2007, p. 97) and "Terahertz technology: a land to be discovered," (M. Koch, Optics and Photonics News, March 2007, p. 21).

In the context of THz spectroscopy, a distinction is generally made between broadband time domain spectroscopy (THz-TDS or THZ time domain spectroscopy) and spectroscopy using a monochromatic THz source (CW or Continuous Wave). As a result of their intrinsically limited frequency resolution, TDS systems are used above all for the spectroscopy of structures with a weak quality factor. In fact, in a typical TDS experience, the time window is 100 ps with a frequency resolution of 5 GHz. On the other hand, continuous and monochromatic CW THz sources have found a vast field of application in astronomical spectroscopy or in the study of chemical reactions taking place in the upper atmosphere where the THz resonances involved often have quality factors of between $10^2$ et $10^6$.

THz spectroscopy also presents important applications in civil and military security, for example in the detection of chemical or explosive agents. In all situations where the analyzed product is in the gaseous phase, the spectra acquired by a CW method have much higher resolution than that from spectra obtained by a TDS method. TDS technology is widely used for characterizing materials in condensed phase.

Concerning TDS sources, conventional THz radiation sources such as gas lasers or backward wave oscillators are expensive and bulky. THz sources based on solid oscillator assemblies are also costly. Today, the devices most often used to generate and detect broadband THz pulses are photoconductive dipole antennas excited by a femtosecond laser that is often expensive and large. Such devices are described in the document, "Sensing with Terahertz Radiation" (D. Mittleman Springer-Verlag, Heidelberg (2003)).

Different sources of the CW type are also known.

A first known source of the CW monochromatic type uses the photomixing technique: Optical heterodyning enables a continuous THz wave to be generated. The beat of two continuous laser diodes emitting around 800 nm and detuned by a few THz induces load oscillation in the conduction band of a semiconductor, such as semi-insulating GaAs or InGaAs. However, the models produced to date are non-integrated systems and the maximum THz powers generated remain relatively low, on the order of 100 nW, as shown by the documents "Photomixing up to 3.8 THz in low-temperature-grown GaAs" (E. R. Brown et al., Appl. Phys. Lett. 66, 285, (1995)) and "Generation and detection of coherent terahertz waves using two photomixers" (S. Verghese et al., Appl. Phys. Lett. 73, 3824 (1998)).

Quantum cascade lasers constitute a second type of monochromatic CW source within the THz range. Such sources are described in the document "Terahertz semiconductor-heterostructure laser," R. Kohler et al., Nature 417, 156 (2002). These sources enable increased power to be generated, but they are not very tunable and only function at cryogenic temperatures. For the latter reason, these sources are bulky and complex systems.

A third known source of the CW type uses the frequency conversion technique. The second-order nonlinear effects are thus used for generating and amplifying THz by following different approaches:
- mixing mid-infrared lasers in bulk GaAs as described in the document "Noncolinear phase matching in GaAs" (L. Aggarwal et al., Appl. Phys. Lett. 22, 239, (1973));
- mixing ultrashort near-infrared pulses in crystals such as ZnSe, LiNbO$_3$ as described in the document "Generation of Far-Infrared Radiation by Picosecond Light Pulses in LiNbO$_3$" (K. H. Yang et al., Appl. Phys. Lett. 19, 320, (1971)), or periodically poled LiNbO$_3$ (PPLN or "Periodically Poled Lithium Niobate") as described in the document "Generation of narrow-band terahertz radiation via optical rectification of femtosecond pulses in periodically poled lithium niobate" (Y.-S. Lee et al., Appl. Phys. Lett. 76, 2505 (2000)).

As a result of its high nonlinear coefficient and its low losses in the THz range (~1 cm$^{-1}$), GaAs constitutes a material of choice for these applications. The document "Terahertz-wave generation in quasi-phase-matched GaAs" (K. L. Vodopyanov et al., Appl. Phys. Lett. 89, 141119, (2006)) describes the generation of THz waves from THz from 0.9 to 3 THz in periodically poled GaAs, with a conversion efficacy of $10^{-3}$ by using two pump beams close to 3 μm.

However, all these systems are not compact or easy to use outside of a research laboratory.

The document "Nonlinear phase matching in THz semiconductor waveguides" (V. Berger and C. Sirtori, Semicond. Sci. Technol. 19, 964 (2004)) proposes using the abnormal dispersion created by absorption by the phonon band in GaAs to phase-tune two near-IR (infrared) pump beams and the THz beam generated in a "ridge" type waveguide; This proposition has not yet been the subject of an experiment. In addition, like the other solutions, it does not enable a compact system to be obtained.

Figure 1:
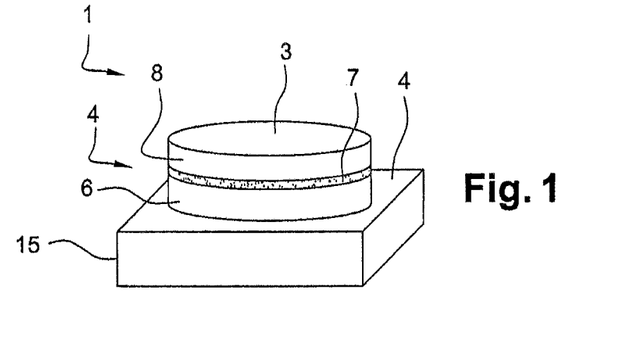
FIG. 1 illustrates an embodiment of a laser device according to the prior art.

A solution to this compactness problem is proposed in patent FR2932616 that describes a compact laser device for emitting light waves in a frequency range of between 0.5 THz and 5 THz to overcome the limitations mentioned above in terms of bulkiness, complexity and cost. FIG. 1 represents an example of such a device 1.

Device 1 is a continuous or quasi-continuous source of THz electromagnetic radiation. Generation of THz radiation is ensured by parametric conversion (i.e., frequency difference) from two optical modes of a whispering gallery mode semiconductor microlaser.

Device 1 thus comprises a cylindrical semiconductor heterostructure 2, each of the ends of which are covered by a metal layer respectively forming an upper mirror 3 and a lower mirror 4. This semiconductor heterostructure 2 rests on a host substrate 15.

Heterostructure 2 comprises a central active layer 7 that behaves as a waveguide in the near-infrared spectrum, surrounded by two doped layers 6 and 8 of a wider bandgap and weaker index, which ensure the optical confinement of the laser modes and the transport of current to the active layer. As a result of its cylindrical geometry, this heterostructure 2 supports high quality factor electromagnetic modes that "circle" in heterostructure 2 due to the total internal reflection of the light at the periphery of the cylinder.

Active layer 7 contains an amplifying medium, constituted for example of an assembly of quantum dots. Due to their size distribution, the gain provided by the quantum dots presents a strong inhomogeneous broadening. The emitting medium provides the gain necessary for simultaneously lasering several optical whispering gallery modes in the near-infrared spectrum.

The material used for the central active layer 7 is for example a gallium arsenide and aluminum alloy (GaAlAs) that is an optically nonlinear semiconductor material in which certain second-order nonlinear coefficients are high. If the conditions necessary for parametric generation by frequency difference are fulfilled, an effective generation of terahertz radiation and continuously emitted powers greater than 0.1 μW are theoretically predicted. It is noted that to obtain this result, two metal layers 3 and 4, for example in gold, must be placed on the top and bottom of the microcylinder 2 to confine the terahertz wave and maximize its covering with the active layer. Due to the sufficiently large diameter of the cylinder (a few tens of microns), whispering gallery modes also exist in the terahertz range.

However, the device described above presents certain difficulties.

In fact, for the terahertz generation by frequency difference to be effective, two near-infrared whispering gallery modes M1 and M2 and a terahertz gallery mode M3 must exist for this structure, that satisfy the two necessary conditions below:

1) energy conservation in the elementary parametric generation process: $v1-v2=v3$ (*) where $vi$ designates the frequency of whispering gallery mode i;
2) the phase tuning condition that can be written, for whispering gallery modes: $m1-m2\pm2=m3$ (**) where $mi$ designates the azimuthal quantum number associated with the whispering gallery mode i.

As a reminder, a whispering gallery mode is characterized by its polarization—transverse electric TE or transverse magnetic TM—and by three integers, that characterize its vertical order (corresponding to the order of the mode along the vertical direction of the cylinder), radial order (corresponding to the order of the mode along the radius of the cylinder) and azimuthal order (azimuthal quantum number).

In practice, even if certain modes satisfying both conditions (*) and (**) exist, it remains difficult to satisfy these two conditions simultaneously.

In addition, the frequency of whispering gallery modes presents a rapid dependence according to the diameter of the cylinder, which should not deviate by more than 20 nm from its nominal value so that conditions (*) and (**) remain satisfied simultaneously. Knowing that the typical diameter of such a cylindrical heterostructure is on the order of 40 μm, the accuracy required is at the limit of current technological possibilities.

Lastly, an after-the-event amendment of the diameter of the cylindrical heterostructure is difficult to envisage without degrading the quality of its lateral surfaces (increase in rugosity), and in turn the quality factor of whispering gallery modes M1 and M2 and the maximum power that may be emitted by the source.

In this context, the object of the present invention is to provide a compact laser device for emitting light waves within a frequency range of between 0.5 THz and 5 THz to overcome limitations in terms of bulkiness, complexity and cost while facilitating the simultaneous fulfillment of energy conservation (*) and phase tuning (**) conditions.

For this purpose, the invention proposes a laser device for emitting waves within a frequency range of between 0.5 THz and 5 THz comprising a semiconductor heterostructure with a substantially cylindrical shape with a circular cross-section, said heterostructure comprising:

a first layer in an optically nonlinear semiconductor material including emitting means capable of emitting at least two optical whispering gallery modes belonging to the near-infrared spectrum, said at least two whispering gallery modes being confined within said first layer and enabling the generation, within said first layer, of radiation within an electromagnetic whispering gallery mode with a frequency of between 0.5 to 5 THz, known as the terahertz mode, said radiation being generated by the difference in frequency of said two whispering gallery modes, the substantially cylindrical geometry of said heterostructure ensuring phase tuning between the two optical whispering gallery modes belonging to the near-infrared spectrum and the terahertz mode at the difference in frequency;

a second and third semiconductor material layer, each presenting an optical index weaker than the index of the material used for said first layer and located on both sides of the first layer;

at least one metal layer located on one end of said heterostructure;

Said device being characterized in that said heterostructure is equipped in its center with a substantially cylindrical hole extending over the entire height of said heterostructure.

Near-infrared is understood to refer to radiation with a wavelength of between 0.7 μm and 1.4 μm.

Optical whispering gallery mode is understood to refer to a mode resulting from the reflection of light rays on the inner cylindrical wall of the first layer forming a microcavity produced in a material of which the refractive index is greater than the medium surrounding it (i.e., air). The rays generally remain confined along the cylindrical wall and do not pass through the center of the microcavity.

Substantially cylindrical shape is understood to refer to a cylindrical or conical shape; In fact, variations in diameter of the cross-section of the structure and/or hole do not disrupt the operation of the device insofar as they remain low. It is easily understood that the production, particularly by etching, of the device may lead to shapes that are not perfectly cylindrical, particularly conical shapes.

The device according to the invention advantageously uses a central cylindrical hole whose diameter forms a new parameter, facilitating the simultaneous fulfillment of conditions (*) and (**), or else simply correcting, after production and testing, the devices not presenting optimal characteristics.

As in the case of the device from FIG. 1, the THz wave is generated by a difference in frequency (i.e., parametric conversion) from two whispering gallery modes belonging to the near-infrared spectrum and present in said first central layer forming a microcavity of the microcylinder type: reflection over the semiconductor-air interface of the microcylinder leads to the formation of THz whispering gallery modes. The whispering gallery modes with a very high quality factor are excited by emitters, such as quantum dots or wells. The emitters are preferentially pumped electrically, but may also be pumped optically.

The device enables the continuous or quasi-continuous emission of THz electromagnetic radiation.

According to the invention, the cylindrical hole at the center of the cylindrical heterostructure enables a semiconductor ring to be formed. This novel geometry is of particular interest since a modification in the radius of the hole modifies the frequency of the terahertz mode M3, which is relocated in the entire volume of the cylinder, while modification of this same radius does not affect the frequency of the near-infrared modes M1 and M2, that are located at the periphery of the cylindrical heterostructure.

Therefore, and consequently, from a triplet of modes verifying condition (**), the hole diameter may be used as an adjustment variable to satisfy condition (*) in the end. In other words, after characterization of the near-infrared whispering gallery modes present in the gain band of the emitters, the pair (m1, m2), and m3 are chosen such that (**) is satisfied (where mi is the azimuthal quantum number associated with the mode of gallery i). The value of the inner radius of the hole which satisfies the condition of resonance (*) may then be deduced. This given hole radius in the center of the cylindrical heterostructure may be produced with the usual nanofabrication tools such as electron lithography or reactive ion etching techniques.

The structure of the device according to the invention thus considerably widens the choice of parameters obtaining the terahertz source.

It is also very useful for designing terahertz microsource systems presenting similar frequencies, for multispectral applications. For a given choice (m1, m2, m3), the terahertz frequency may in fact be defined by adjusting the outer diameter of the cylinder to modify v1−v2, and then adjust the size of the hole to satisfy condition (*).

In addition, the existence of the central hole according to the invention corrects the terahertz source after it has been tested. In fact, the size or the shape of the hole may easily be modified to adjust the frequency v3, for example by removing or adding material by using an etching instrument and focused ion beam. (FIB) deposition. It will be noted that possible degradation of the hole surface quality does not affect the quality factor of modes M1 and M2, located near the outer surface of the cylinder, or that of mode M3, which is very low.

The device according to the invention also has all the advantages of the device from the prior art as represented in FIG. 1.

Thus, the cylindrical geometry of the invention with emitters inside the first cylindrical layer makes it possible to generate high THz powers within a compact source. The cylindrical symmetry of the first central layer in an optically nonlinear semiconductor material, such as GaAs, promotes phase tuning between the optical whispering gallery modes and the THz mode.

The metal layer situated on one end of the cylindrical heterostructure ensures the vertical confinement of the THz mode in accordance with the principle of metal plasmonic guides. This confinement enables the efficacy of the nonlinear conversion rate to be increased. The metal layer also enables injection of charge carriers in the case of electric pumping of the emitters.

The geometry according to the invention also makes it possible to simultaneously and independently optimize the vertical confinement of the optical whispering gallery modes and of the THz mode by adjusting the thicknesses of the different layers, in particular the thicknesses of the second and third layers in a semiconductor material such as AlGaAs. This makes it possible to maximize overlap between the optical modes and the THz mode. It will be noted that the second and third layers not only make it possible to adjust the spacing between the mirror and the active layer comprising emitters, but also to achieve lateral optical confinement of the THz mode.

The geometry according to the invention also offers, as a result of its cylindrical shape without narrowing, good evacuation of heat to the substrate, ensuring stability of the power of the properties of the laser and enabling laser powers compatible with nonlinear THz generation to be reached.

The device according to the invention may be used for any application requiring this type of source, knowing that systems based on THz sources are found in imaging, spectroscopy, wireless communications, sensors, metrology and defense.

The device according to the invention exceeds the current state of the art on the generation of frequencies greater than 1 THz, i.e., the photomixing of two laser lines with a difference in frequencies corresponding to the THz frequency generated.

The device according to the invention may also present one or more of the characteristics below, considered individually or according to all technically possible combinations:

the deviation between the radius of the cylinder forming said heterostructure and the radius of the hole is greater than $$0.05 \times \frac{\lambda_{THz}}{n_{THz}}$$

where $\lambda_{THz}$ is the emission wavelength in the frequency range of between 0.5 THz and 5 THz and $n_{THz}$ is the effective index of propagation of the terahertz mode at the wavelength $\lambda_{THz}$;

said semiconductor heterostructure rests on a base that is capable of cooling said heterostructure;

the device according to the invention comprises an adjusting element made in a low-absorbing material in the frequency range of between 0.5 THz and 5 THz, said adjusting element having a size smaller than that of said hole and being inserted in said hole;

said element is a substantially cylindrical tip with a circular cross-section;

said tip presents a diameter equal to or greater than a third of the diameter of said hole;

said tip presents a diameter equal to or less than three-fourths of the diameter of said hole;

the material of said adjusting element is a metal material or a semiconductor semi-insulating material such as a non-doped semiconductor material;

The device according to the invention comprises means to displace said adjusting element according to the height of said hole such that the deviation between said element and the bottom of said hole is adjustable.

said device according to the invention comprises two metal layers, each situated at one end of said heterostructure;

said metal layer or layers is or are made of gold;

said emitting means are chosen from among quantum dots, quantum cascade structures and quantum wells advantageously having different thicknesses;

said optically nonlinear semiconductor material of said first layer is a III-V material such as $Al_yGa_{1-y}As$ with $0 \leq y \leq 0.6$ or InGaAsP or a II-VI material;

the semiconductor material of said second and third layers is a material from the same family as the material from the first layer and with a wider bandgap than that of the material from the first layer; For example:

for $Al_yGa_{1-y}As$ in the first layer, the material $Al_xGa_{1-x}As$ may be chosen with $0.2 \leq x \leq 0.9$ and $x>y$;

for InGaAsP in the first layer, InP may be chosen;

for a II-VI material in the first layer, another II-VI may be chosen;

said second semiconductor layer is a p-doped layer and said third semiconductor layer is an n-doped layer;

said first layer includes a plurality of emitter planes;

the thickness of said second and third layer is between 0.5 and 5 µm;

the device according to the invention comprises two electrical contacts for injecting a pumping current of said emitting means;

the thickness of said first layer is between 200 and 700 nm;

the diameter of said cylindrical heterostructure is between 30 and 100 µm;

Said first layer is a layer that is not intentionally doped.

Another object of the present invention is a method of adjusting the frequency of the terahertz mode in a device according to the invention characterized in that the method comprises a step consisting of adjusting the height of insertion of the adjusting element in the hole so as to obtain the desired terahertz frequency.

Therefore, an adjusting element that is non-absorbing in the terahertz spectrum (for example a metal or semiconductor tip) may also be moved close to the hole, or inserted in it, or displaced inside the hole in order to modify the frequency of the terahertz whispering gallery mode. One may also contemplate performing this operation to adjust and optimize the properties of the terahertz source, while it is in operation, to optimize the satisfaction of condition (*), and thus the power emitted by the source. This optimization in operando particularly compensates for the effect of a temperature change, whether due to a variation in ambient temperature or to a variation in the internal temperature of the component due to a change in the operational conditions (ex.: Injected current). One will then use, for example, an actuator system, enabling the terahertz power generated at frequency v3 to be continuously optimized by adjusting the position of the mobile object inserted in the hole, according to the terahertz power measured by a control detector.

Another object of the present invention is a method of adjusting the frequency of the terahertz mode in a device according to the invention characterized in that the method comprises a step consisting of modifying the size of the hole so as to obtain the desired terahertz frequency.

Advantageously, said step consisting of modifying the size of the hole is a step of removing or adding material.

Other characteristics and advantages of the invention will clearly emerge from the description given below, for indicative and in no way limiting purposes, with reference to the attached figures, among which:

In all the following figures, common elements bear the same reference numbers.

Figure 2:
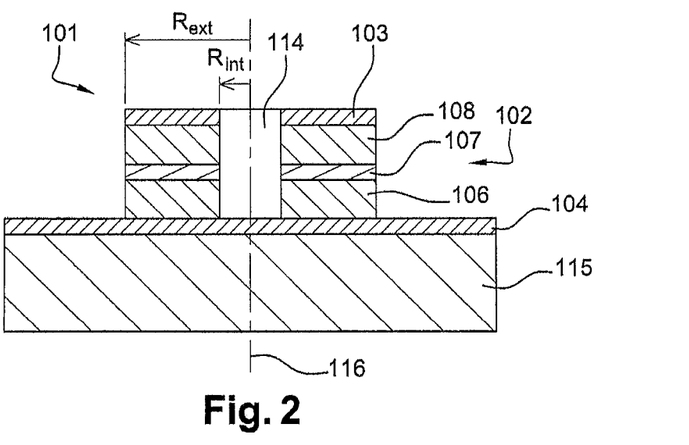
FIGS. 2 and 3 illustrate an embodiment of a laser device according to the invention.

FIG. 2 represents an embodiment of a laser device 101 according to the invention.

Device 101 according to the invention is a continuous or quasi-continuous source of THz electromagnetic radiation. Generation of THz radiation is ensured by parametric conversion (i.e., frequency difference) from two optical modes of a whispering gallery mode semiconductor microlaser.

Device 101 thus comprises a cylindrical semiconductor heterostructure 102 with a circular cross-section, of which the ends are each covered by a metal layer (for example in gold) respectively forming an upper mirror 103 and a lower mirror 104. The diameter of the cylindrical heterostructure 2 is typically between 30 and 100 µm.

The heterostructure rests on a substrate 115.

This semiconductor heterostructure is equipped with a hole 114 in its center; The hole 114 has a cylindrical shape, the cylinder forming said hole having a circular cross-section and extending over the entire height h of heterostructure 102. In other words, the cylinders respectively forming the heterostructure 102 and the hole 114 are concentric, the radius $R_{int}$ of the cylinder forming the hole 114 being less than the radius $R_{ext}$ of the external cylinder forming the heterostructure 102. For the sake of clarity, radii $R_{int}$ and $R_{ext}$ are not to scale. Device 101 has a cylindrical axis of symmetry represented by dotted line 116.

The semiconductor heterostructure 102 rests on a host substrate 115 that is a good electrical and thermal conductor, for example a metal substrate or a doped GaAs substrate covered by a metal layer 104 forming the lower mirror.

Figure 3:
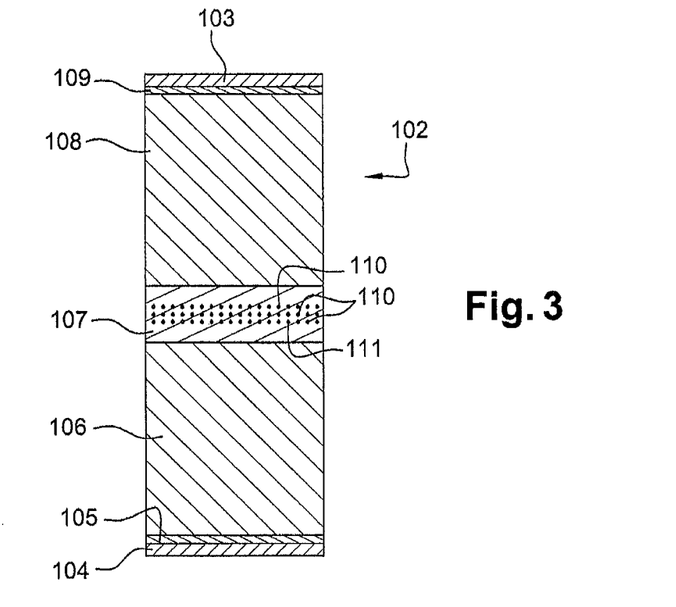

Cylindrical heterostructure 102 comprises a plurality of layers each having the shape of a ring of radius Rint; this plurality of layers is illustrated in FIG. 3. It will be noted that lower mirror 104 is represented in FIG. 3 but here does not have an annular shape; in other words, it is not an integral part of the cylindrical geometry equipped with hole 115. Thus, cylindrical heterostructure 102 comprises, from the bottom upwards;

a thin layer 105 (a few nm, typically between 2 and 30 nm) of p-doped GaAs;

a layer 106 of p-doped $Al_xGa_{1-x}As$ alloy (typically with $0.2 \leq x \leq 0.9$) of which the optical index is weaker than that of the material of the active layer and of which the thickness is for example between 0.5 and 5 µm and preferentially between 0.5 and 3 µm;

an active layer 107;

a layer 108 of n-doped AlxGa1-xAs alloy (typically with $0.2 \leq x \leq 0.9$) of which the optical index is weaker than that of the material of the active layer and of which the thickness is for example between 0.5 and 5 µm and preferentially between 0.5 and 3 µm;

a thin layer 109 (a few nm, typically between 2 and 30 nm) of n-doped GaAs;

The upper mirror 103.

Active layer 107 is a layer of GaAs or $Al_xGa_{1-x}As$ that is not intentionally doped having a thickness typically of between 200 and 700 nm. Layer 107 of $Al_xGa_{1-x}As$ also contains an emitting medium, here a plurality of planes 110 of quantum dots 111: A single plane of quantum dots may be sufficient and one or more quantum wells may also be used. Here the emitting medium is pumped electrically. Two electrical contacts, not represented, are provided for this purpose. The quantum dots 111 procure the gain necessary for ensuring the laser effect.

The electrically pumped emitting medium of course implies adequate doping of the semiconductor heterostructure 102. Thus, as described above, lower layer 106 of $Al_xGa_{1-x}As$ and thin layer 105 of GaAs in contact with lower mirror 104 are p-doped while upper layer 108 of $Al_xGa_{1-x}As$ and thin layer 109 of GaAs in contact with upper mirror 3 are n-doped.

It will be noted that thin layers 105 and 109 are only represented in FIG. 3 for the sake of simplification of FIG. 2.

Confinement of the two near-infrared whispering gallery modes is ensured by the active layer 107. The cylindrical geometry of the active layer 107 ensures vertical confinement of the near-infrared light and the reflection on the semiconductor-air interface of this microcylindrical layer 107 gives rise to near-infrared whispering gallery modes.

The vertical confinement of the THz mode is ensured by the two upper and lower mirrors 103 and 104. These two metal mirrors 103 and 104 form a guide for the THz electromagnetic waves and ensure record vertical confinement of the THz mode according to the principle of plasmonic metal guides for THz waves. This confinement enables the efficacy of the nonlinear conversion rate to be increased in the context of device 101 according to the invention. It will be noted that the principle of a plasmonic metal guide may also be applied with a single mirror (in this case, the vertical confinement of the THz mode is also of the plasmonic type but with a single mirror permitting optical excitation of the emitters, however the presence of a single mirror leads to a loss in confinement of the THz mode). Reflection on the semiconductor-air interface of the microcylinder leads to the formation of THz whispering gallery modes. Layers 106 and 108 of $Al_xGa_{1-x}As$ make it possible to move the guided mode further away from metal mirrors 103 and 104 and to limit optical losses by absorption in the metal. The infrared optical modes confined in the central active layer 107 tend to "run" into layers 106 and 108. Consequently, if the metal mirrors are too close to the central layer, the infrared optical modes are likely to be absorbed by the metal. The thickness of layers 106 and 108 of $Al_xGa_{1-x}As$ is thus chosen so as to minimize the losses of the infrared optical modes.

According to the invention, the same semiconductor heterostructure 102 ensures the functions of a pump laser source and frequency conversion. This approach potentially enables all the problems of optical alignment to be eliminated and greatly simplifies the assembly of the device 101 according to the invention. It results in an extremely compact THz radiation emitting device 101.

It will be noted that it is also possible to reverse the p-doped and n-doped layers (i.e., to move the layers with n-doping to the upper level and the layers with p-doping to the lower level) without departing from the context of the invention: The electrical contact points will of course be adapted to the type of doping.

For a purely illustrative purpose, an example of the sizing of device 101 according to the invention will be found below:
thickness of the active guide layer 107 of $Al_{0.34}Ga_{0.66}As$: 500 nm;
composition and thickness of the optical confinement spacer layers 106 and 108: $Al_{0.8}Ga_{0.2}As$, 2 µm;
thickness of the p-doped and n-doped thin layers of GaAs 105 and 109: 20 nm;
radius $R_{ext}$ of the cylindrical heterostructure 102: 17.48 µm;
radius Rint of the cylindrical hole 114: 15.72 µm In the example illustrated above, calculation of the whispering gallery modes of the structure shows that the energy conservation (*) and phase tuning (**) conditions are obtained between the near-infrared modes and the terahertz mode of which the frequencies and azimuthal quantum numbers (or orders) are the following at an operational temperature of 300K:
m1=253 and ν1=230.50 THz (λ1=1.3006 µm) for the first near-infrared mode M1;
m2=249 and ν2=227.23 THz (λ2=1.3194 µm) for the second near-infrared mode M2;
m3=2 and ν3=3.27 THz (λ3=91.79 µm) for the terahertz mode M3.

Here the emission wavelength of the quantum dots is chosen in the vicinity of 1.31 µm. The spectral width of the quantum dot emission bands is on the order of 40 meV, which enables the laser effect for near-infrared modes M1 and M2 to be obtained.

As already mentioned above, near-infrared is understood to refer to radiation with a wavelength of between 0.7 µm and 1.4 µm and whispering gallery mode refers to a mode resulting from the reflection of light rays on the inner wall of layer 107 forming a cylindrical microcavity.

It will be noted that, for the set of parameters mentioned above, there is no, in the absence of hole 114, terahertz mode enabling the two energy conservation (*) and phase tuning (**) conditions to be simultaneously satisfied.

Figure 4:
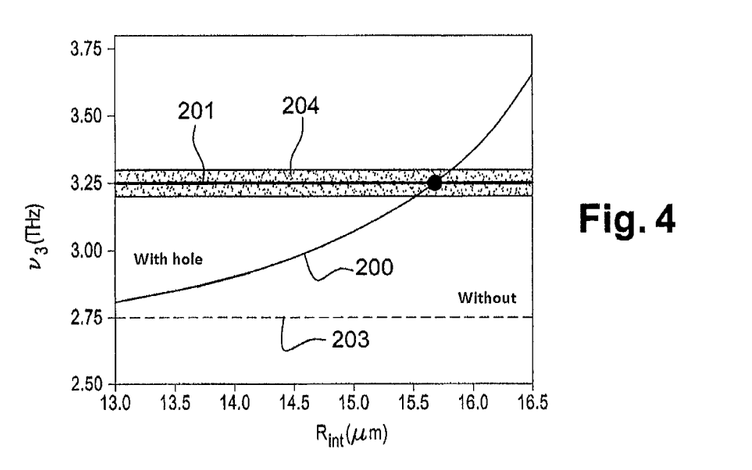
FIG. 4 represents the variation in frequency of the terahertz mode and the difference in frequencies of the near-infrared modes according to the inner radius of the device according to the invention.

FIG. 4 presents the variation (curve 200) in the THz frequency ν3 of the whispering gallery mode of index m3 (here m3=2) according to the radius $R_{int}$ of the central hole, all other parameters being kept constant. It will be noted that the frequency of the THz mode of index m3=2 continuously increases according to the internal radius $R_{int}$. The energy conservation relationship (*) is satisfied for an inner radius $R_{int}$ of 15.72 µm corresponding to the value of the radius described above with reference to FIGS. 2 and 3. This value is obtained by taking the intersection of curve 200 and curve 201 illustrating the frequency difference in the near-infrared modes of order m1 (here m1=253) and m2 (here m2=249). Curve 201 is a constant curve according to the radius (i.e. the frequency difference in the near-infrared modes of order m1=253 and m2=249 is equal to 3.27 THz regardless of the radius $R_{int}$). Zone 204 diagrams the spectral width of the THz mode (typical quality factor Q~40).

Without hole 114, frequency ν3 is constant and equal to 2.75 THz (dotted line 203) and therefore the energy conservation condition cannot be satisfied.}

It is observed in FIG. 4 that the required accuracy (determined via the spectral width 204) on the inner radius $R_{int}$ of hole 104 for obtaining the energy conservation condition (*) is on the order of 0.2 µm. The required accuracy is thus much less demanding than for a device such as device 1 from FIG. 1. Remember that for a full cylinder such as represented in FIG. 1, the required accuracy on the diameter of the cylinder is ten times smaller (0.02 µm).

FIG. 4 illustrates a second interest in the ring geometry (i.e., perforated cylinder): The relatively slow variation in frequency ν3 of the THz mode m3 according to the inner radius $R_{int}$ makes it possible to more easily make a structure satisfying conditions (*) and (**).

According to a first approach, one may start by manufacturing a microcylinder; After characterization of the near-infrared whispering gallery modes present in the gain band of the quantum dots, the pair (m1, m2), and m3 is chosen such that the phase tuning condition (**) is satisfied. The value of the radius of hole 104 $R_{int}$ may then be deduced, as in FIG. 4, which enables the energy conservation condition, also known as the resonance condition (*) to be satisfied. It is easy for the person skilled in the art to then make a hole of radius $R_{int}$ in the center of the cylinder with known nanofabrication tools, for example electron lithography and reactive ion etching.

According to a second approach, an annular type structure may be manufactured directly, and then the inner radius of the structure (i.e., the radius $R_{int}$) may be corrected after characterization and measurement of the whispering gallery modes, by using, for example, focused ion beam etching. If this second approach is adopted, an initial radius $R_{int}$ that is slightly too small for the ring will preferentially be chosen, so as to be able to then adjust it to its optimal value during the ion beam etching step.

The approaches that have just been described enable a microsource of THz radiation to be manufactured for which the resonance condition (*) is satisfied in the vicinity of a given temperature, for example ambient temperature (T close to 300K).

However, during operation, the internal temperature of the component rises, due to heat dissipation by Joule effect. When the current injected into the microsource increases, the refractive index of the semiconductor materials forming the heterostructure, and thus the gallery frequency, are modified. The system will thus progressively deviate from the resonance condition (*), necessary for effective parametric generation. By way of example, a variation of 10° C. modifies v1−v2−v3 by a few GHz. This effect thus limits the maximum THz power likely to be emitted by the source.

In addition, the spectral shift of the gain curve induced by temperature elevation may lead to the extinction of near-infrared laser modes, and the appearance of the laser effect for new modes. Such modifications in the microlaser emission spectrum also deviate from the resonance condition (*) system.

In a particularly advantageous manner, it is thus desirable to add an additional control means, which enables satisfaction of condition (*) to be optimized, and enables the deviations induced by the temperature elevation during operation to be corrected.

For example, the device according to the invention may be fitted on a cooled base, for example by the Peltier effect. One may then adjust the temperature of the base to adjust the internal temperature of the component, and optimize the THz power emitted, regardless of the current injected into the device.

According to another embodiment of the invention, which may possibly be combined with the temperature control mentioned above, mechanical actuation may be implemented inside the device according to the invention.

Figure 5:
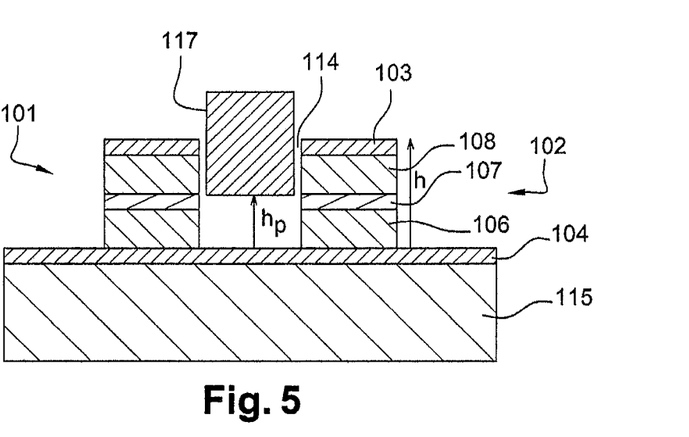
FIG. 5 represents the device from FIG. 2 equipped with an adjusting element.

By way of example, FIG. 5 illustrates a device 101 according to the invention for which a metal rod 117 is introduced in the central hole 114. The metal rod 117 here has the shape of a cylindrical tip with a diameter of 1.8. $R_{int}$ where $R_{int}$ still designates the radius of hole 114. The material used for making tip 117 is not very absorbent in the spectral THz range.

With the exception of this rod inserted in hole 114, device 101 is identical to that illustrated in FIG. 2.

The position of this rod 117 may be defined very precisely, laterally and/or vertically, for example by using piezoelectric positioners, not represented. The height $h_p$ of metal rod 117 may thus be varied with relation to the bottom of the hole.

Figure 6:
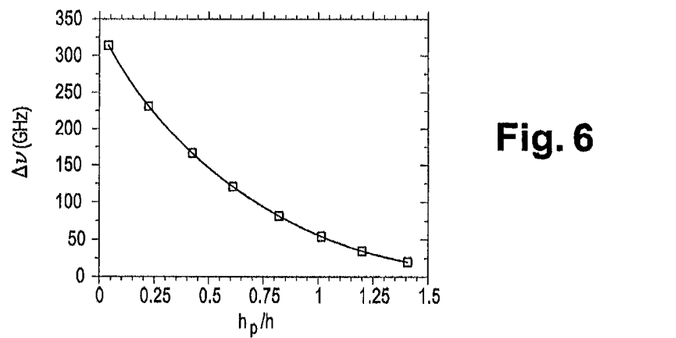
FIGS. 6 to 8 illustrate the evolution in the frequency shift of the terahertz mode according to the different parameters.
Figure 7:
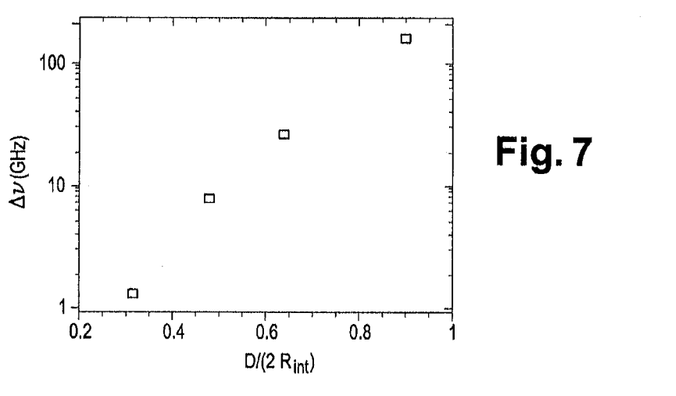

FIG. 6 presents the frequency shift of the THz mode induced by the metal tip 117, according to its vertical position (more precisely according to the ratio $h_p/h$ where h designates the height of the heterostructure 102). For the structure described with reference to FIG. 2 and a tip diameter of 28.2 µm, displacement of the tip enables a fine adjustment of the frequency of the THz mode over a range of approximately 0.3 THz. It is important that the tip diameter is comparable to the inner diameter of the ring, since the spectral tunability range is definitely narrower when the tip diameter is reduced; This phenomenon is particularly illustrated in FIG. 7 that represents the frequency shift of the THz mode according to the ratio $D/(2R_{int})$ for a given height $h_p$ (here $h_p$ is equal to 0.5 h), where D designates the tip 117 diameter and $R_{int}$ designates the radius of hole 114. In practice, a tip with a diameter greater than one third of the diameter of the inner radius will be chosen.

Remarkably, by adjusting the position of tip 117 with a diameter of 1.8 $R_{int}$, one may correct the effect of an internal temperature variation of the device of more than 1000K, therefore much greater than the variations likely to be observed in practice. The resonance condition (*) may be maintained, via actuation of the position of the tip, over the entire operational range of the source. This actuation may be carried out in real time, so as to maximize the THz power emitted by the source at any time.

The broad tuning range accessible by using this tip may also be used, of course, to correct a deviation of dimensions of the source with relation to its nominal parameters.

A tip made of a material of a different nature may be used, as long as the material used is not very absorbent in the spectral THz range. By way of example, a tip made from a semiconductor material such as GaAs, InP or GaN may be used.

Preferentially, a semiconductor semi-insulating tip, for example based on a non-doped semiconductor, will be used. Such a non-conductive tip does not in fact risk short-circuiting the junction of the source in the case of the accidental contact of the tip with the inner edge of the ring (i.e., the surface of hole 114).

Figure 8:
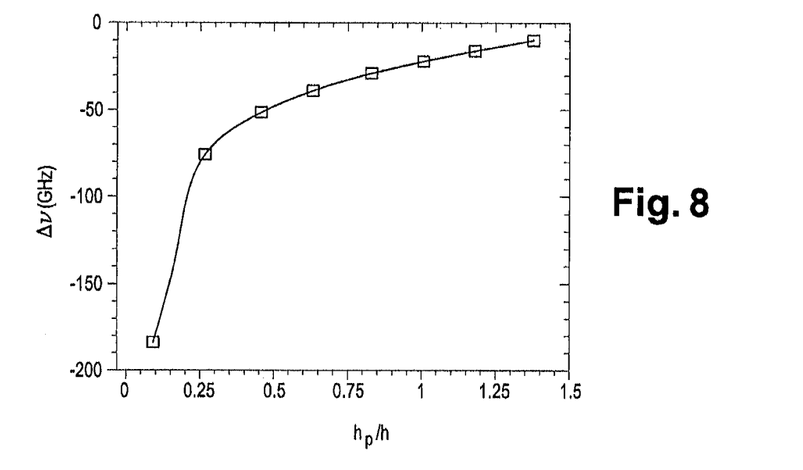

FIG. 8 presents the spectral shift induced by the introduction of a cylindrical tip in GaAs on the THz mode (the dimensions of the device are the same as for FIG. 2, and the diameter of the tip is equal to 0.5 $R_{int}$) according to the ratio $h_p/h$ where h designates the height of the heterostructure. Unlike the metal tip, which introduces a shift towards high frequencies, the semiconductor tip induces a shift of the THz mode towards the low frequencies. Here again the broad tunability range of the THz mode enables satisfaction of the resonance condition (*) to be optimized over the entire operational range of the source, or enables a deviation of the source with relation to its nominal manufacturing parameters to be corrected.

With regard to the dimensions of tip 117, the latter must have a sufficiently large diameter, preferentially equal to or greater than one third of the inner diameter of hole 114. In addition, its diameter is preferentially equal to or less than ¾ of the diameter of hole 114 such that the THz mode is confined between the metal layers.

FIGS. 9a to 9f illustrate the various steps of an example of the method of producing device 101 according to the invention.

Figure 9A:
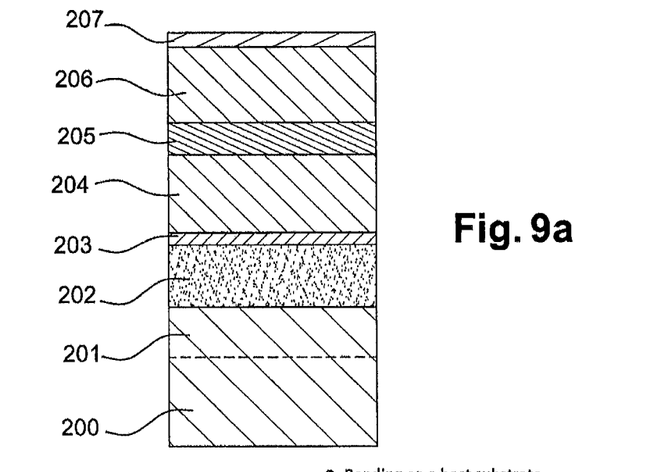
FIGS. 9a to 9f illustrate the different steps of a method of manufacturing a device such as represented in FIGS. 2 and 3.

The first step represented in FIG. 9a is constituted of a step of epitaxial growth to obtain different layers of the semiconductor heterostructure. The semiconductor heterostructure is produced by a conventional growth technique, such as molecular jet epitaxy (MJE) or organometallic vapor phase epitaxy (OMVPE).

On a substrate 200 in GaAs, a buffer layer 201 in GaAs, typically to a thickness that may vary from 0.5 to 1 µm (used to obtain a surface presenting a better quality than the surface of substrate 200), a sacrificial layer 202 of GaAlAs with a high Al composition (for example 500 nm of $Ga_{0.1}Al_{0.9}As$), and then different semiconductor layers such as represented in FIG. 3 between the two metal mirrors, are deposited by following the sequence: GaAs-n (reference 203, for example to a thickness of 20 nm)/Al$_x$Ga$_{1-x}$As-n (reference 204, for example n-doped Al$_{0.8}$Ga$_{0.2}$As to a thickness of 2 μm)/Al$_x$Ga$_{1-x}$As-nid (reference 205, for example non-intentionally doped Al$_{0.34}$Ga$_{0.66}$As to a thickness of 500 nm)/Al$_x$Ga$_{1-x}$As-p (reference 206 for example p-doped Al$_{0.8}$Ga$_{0.2}$As to a thickness of 2 μm)/GaAs-p (reference 207).

The p- and n-doped thin layers of GaAs 207 and 203 on both sides of the active structure are used to prevent oxidation of the layers of GaAlAs, potentially detrimental to the proper operation of the component.

The growth of the non-intentionally doped layer 205 Al$_x$Ga$_{1-x}$As is interrupted one or more times to insert the near-infrared emitters (quantum wells or quantum dot planes).

Figure 9B:
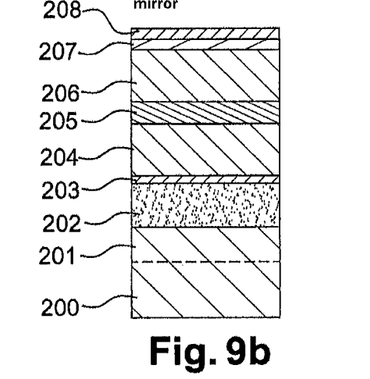

With reference to FIG. 9b, a stack 208 intended to ensure good electrical contact with the p-type doped confinement layer, and to form the lower gold mirror, is deposited. To do this, the following stack 208 may be used: Ti (10 nm) Pt (40 nm) Au (250 nm).

Figure 9C:
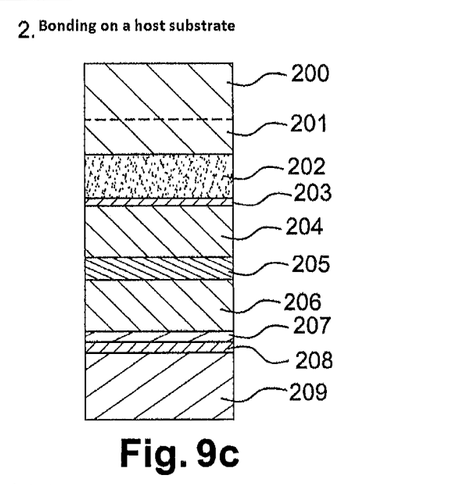

With reference to FIG. 9c, the epitaxied structure obtained following the steps from FIGS. 9a and 9b is then turned over and transferred by bonding onto a host substrate 209. The transfer of this structure onto the host substrate 209 may be achieved by using a common bonding technique (molecular bonding, soldering, bonding with an epoxy adhesive).

The host substrate 209 is a substrate that is a good conductor of heat and electricity, for example a metal substrate or a substrate of doped GaAs.

Figure 9D:
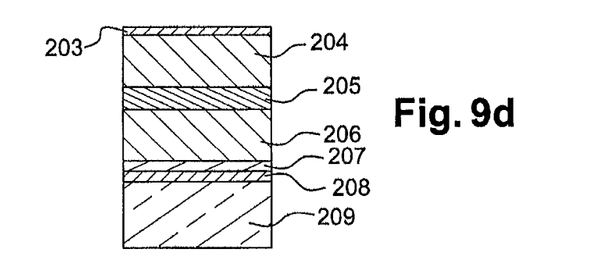

According to the step illustrated in FIG. 9d, initial substrate 200 of GaAs is then thinned by mechanical abrasion, to a thickness on the order of 50 μm. The remaining substrate is then eliminated by selective chemical attack, by using the sacrificial layer 202 of AlGaAs as a barrier layer. It will be noted that the buffer layer 201 of GaAs is eliminated at the same time as the substrate 200. Lastly, the sacrificial layer 202 of AlGaAs is removed by a new selective chemical attack that releases the surface of the layer 203 of GaAs-n in view of subsequent technological steps. This thin layer 203 of GaAs-n protects the underlying layer 204 of n-doped Al$_x$Ga$_{1-x}$As from oxidation.

Figure 9E:
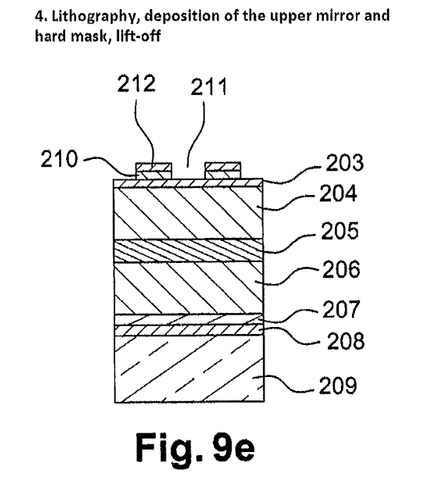

FIG. 9e illustrates the step of depositing the upper mirror and defining the perforated cylindrical geometry of the heterostructure. A level of lithography is used for this that enables the upper annular metal mirror 210 with a diameter equal to the diameter of the heterostructure in a cylindrical shape and presenting in its center a hole 211 with a diameter equal to the diameter of hole 114 of FIG. 2 to be defined by a "lift-off" type process.

The upper metal mirror 210 is then either used directly as an etching mask or is covered by an n-type contact layer 212 (for example Ni (5 nm) Ge (10 nm) Au (20 nm) Ni (5 nm)). Layers 210 and 212 are possibly reinforced by the deposition of an additional metal layer, for example 50 nm of nickel.

The perforated cylindrical geometry is then defined by reactive ionic etching RIE, for example by using a mixture of chlorinated gases.

Figure 9F:
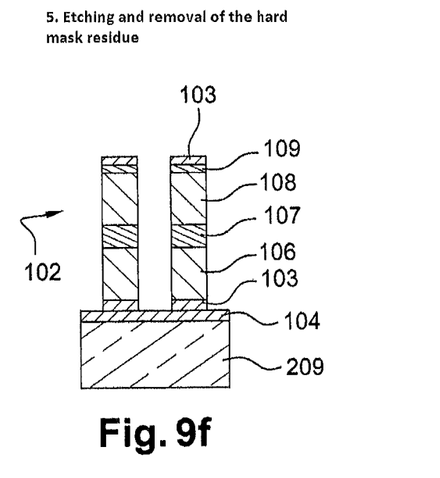

FIG. 9f shows the semiconductor heterostructure 102 with a cylindrical geometry comprising, from the bottom upwards:
lower mirror 104;
the thin layer 105 of p-doped GaAs;
the layer 106 of p-doped Al$_x$Ga$_{1-x}$As alloy;
the active layer 107;
the layer 108 of n-doped AlxGa1-xAs alloy;
the thin layer 109 of n-doped GaAs;
The upper mirror 103.

The manufacturing method described above is adapted to the parallel production of several devices according to the invention, enabling the production of THz emitting matrices, for high-power THz generation applications, or selective frequency sources known as agile frequency sources.

Of course, the device and process according to the invention are not limited to the embodiments that have just been described for indicative and in no way limiting purposes with reference to FIGS. 2 to 9f.

In particular, the semiconductor heterostructure with a cylindrical geometry may for example be made from another family of III-V or II-VI semiconductor materials, for example the InP/InGaAs/InAs family, and either quantum dots or quantum wells may be used, as explained previously. The interest of this family is, in particular, the weakly recombinant character of the surface of these materials, with relation to GaAs/GaAlAs. It is therefore expected that charge carrier losses by non-radioactive recombination on lateral etched surfaces will be significantly reduced.

As relating to the gain material, in certain cases quantum dot planes may be advantageously replaced by one or more quantum wells. One may in particular use several quantum wells of different thicknesses, and structure the gain curve such that it presents two maxima in the vicinity of v1 and v2. For the structure described in FIG. 2, the laser effect may then be obtained for M1 (of index m1) and M2 (of index m1+4), without lasering the intermediate whispering gallery modes of index m1+1, m1+2 and m1+3.

Other metals such as gold, or a metal alloy may be chosen to produce THz radiation vertical confinement mirrors.

In the case of the cylindrical source described in patent FR2932616, making the central part of the cylinder insulating, for example by using an ion implantation step, was proposed. This insulating zone enables electric current to be selectively injected at the edge of the cylinder, and whispering gallery modes M1 and M2 to be pumped more effectively. This approach potentially enables the threshold current necessary for initiating the laser effect in these modes to be reduced, the heating of the source to be reduced and the maximum power that may be emitted by the latter to be increased. In another application mode of the invention, one may combine the use of the cylindrical geometry equipped with a hole and an insulating zone situated on the interior side of the ring (i.e., the side of the heterostructure surface defining the hole), and enable the current to be preferentially injected on the side of the outer edge of the ring, where modes M1 and M2 are located.

In order to modify and control the radiation pattern of the THz source, one may also structure the underlying metal plane, or add microstructures above the source, to benefit from an antenna effect. In the case where a metal tip is used, one may structure the tip itself to make this antenna.

The invention claimed is:

1. A laser device for emitting waves within a frequency range of between 0.5 THz and 5 THz comprising a semiconductor heterostructure with a substantially cylindrical shape with a circular cross-section, said heterostructure comprising:
a first layer in an optically nonlinear semiconductor material including emitters configured to emit in at least two optical whispering gallery modes belonging to the near-infrared spectrum, said at least two whispering gallery modes being confined within said first layer and enabling the generation, within said first layer, of radiation within an electromagnetic whispering gallery mode with a frequency of between 0.5 to 5 THz, said radiation being generated by the difference in frequency of said two whispering gallery modes, the substantially cylindrical geometry of said heterostructure ensuring phase tuning between the two optical whispering gallery modes belonging to the near-infrared spectrum and the terahertz mode at the difference in frequency;

a second and a third semiconductor material layer, each presenting a smaller optical index than the index of the material used for said first layer and located on both sides of the first layer;

at least one metal layer located on one end of said heterostructure;

wherein said heterostructure includes in its center a hole with a substantially cylindrical shape extending over the entire height of said heterostructure, a radius of said hole being chosen to establish the phase tuning;

a deviation between a radius of the cylinder forming said heterostructure and the radius ($R_{int}$) of the hole is greater than $$0.05 \times \frac{\lambda_{THz}}{n_{THz}}$$

where $\lambda_{THz}$ is the emission wavelength in the frequency range of between 0.5 THz and 5 THz and $n_{THz}$ is the effective index of propagation of the terahertz mode at the wavelength $\lambda_{THz}$.

2. The device according to claim 1, wherein said semiconductor heterostructure rests on a base that is capable of cooling said heterostructure.

3. The device according to claim 1, wherein said emitters are chosen from among quantum dots, quantum cascade structures and quantum wells.

4. The device according to claim 1, comprising an adjusting element made in a low-absorbing material in the frequency range of between 0.5 THz and 5 THz, said adjusting element having a size smaller than that of said hole and being inserted in said hole.

5. The device according to claim 4, wherein said element is a tip with a substantially cylindrical shape with a circular cross-section.

6. The device according to claim 5, wherein said tip presents a diameter equal to or greater than one third of the diameter of said hole.

7. The device according to claim 6, wherein said tip presents a diameter equal to or less than three fourths of the diameter of said hole.

8. The device according to claim 5, wherein the material of said adjusting element is a metal material or a semiconductor semi-insulating material such as a non-doped semiconductor material.

9. The device according to claim 5, comprising means to displace said adjusting element according to the height of said hole such that the deviation between said element and the bottom of said hole is adjustable.

10. A method of adjusting the frequency of the terahertz mode in a device according to claim 4, comprising adjusting the height of insertion of the adjusting element in the hole so as to obtain the desired terahertz frequency.

11. A method of adjusting the frequency of the terahertz mode in a device according to claim 1, comprising modifying the size of the hole so as to obtain the desired terahertz frequency.

12. The method according to claim 11, wherein modifying the size of the hole includes removing or adding material.

13. The device according to claim 1, wherein a first end of said hole is in contact with a structure on which said heterostructure rests.

14. The device according to claim 13, wherein said structure is said at least one metal layer.

* * * * *